United States Patent
Kim et al.

(10) Patent No.: US 7,154,076 B2
(45) Date of Patent: Dec. 26, 2006

(54) IMAGE SENSING DEVICE INCLUDING IMAGE SENSOR WITH HIGH DYNAMIC RANGE

(75) Inventors: Heung Sik Kim, Seoul (KR); Yong Ahn Ha, Daejeon (KR); Ui Chol Yl, San Francisco, CA (US); Jin Heon Kim, Seoul (KR); Woo Hyun Kwon, Seongnam (KR); Jong Sun Won, Gunpo (KR); Hak Dae Lee, Seoul (KR); Seung Hyun Cha, Seoul (KR); Seung Chul Lee, Incheon (KR); Tae Sun Shin, Seoul (KR)

(73) Assignee: C'est Image, Inc., Seoul (KR)

(*) Notice: Subject to any disclaimer, the term of this patent is extended or adjusted under 35 U.S.C. 154(b) by 0 days.

(21) Appl. No.: 11/177,527

(22) Filed: Jul. 7, 2005

(65) Prior Publication Data
US 2006/0097130 A1    May 11, 2006

(30) Foreign Application Priority Data
Nov. 5, 2004 (KR) .................. 10-2004-0089774
Dec. 24, 2004 (KR) .................. 10-2004-0112146

(51) Int. Cl.
*H01L 27/00*  (2006.01)

(52) U.S. Cl. .................... 250/208.1; 348/315
(58) Field of Classification Search ............ 250/208.1, 250/214.1; 348/275, 311, 315, 319; 257/448, 257/459, 465
See application file for complete search history.

(56) References Cited

U.S. PATENT DOCUMENTS
2004/0145664 A1* 7/2004 Kobayashi et al. ......... 348/246

FOREIGN PATENT DOCUMENTS
JP          09-307091          11/1997

* cited by examiner

*Primary Examiner*—Thanh X. Luu
(74) *Attorney, Agent, or Firm*—Thelen Reid & Priest LLP

(57) ABSTRACT

An image sensor with a high dynamic range is provided. The image sensor includes a semiconductor substrate, a plurality of light-receiving elements formed on the semiconductor substrate, and light-shield films formed on upper ends of some of the light-receiving elements to partially block light incident upon each of the some light-receiving elements. Hence, an image sensing device including the image sensor can detect an accurate image regardless of whether the environment is bright or dark.

3 Claims, 5 Drawing Sheets

IMAGE SENSING DEVICE INCLUDING IMAGE SENSOR WITH HIGH DYNAMIC RANGE

CROSS-REFERENCE TO RELATED PATENT APPLICATIONS

This application claims the benefit of Korean Patent Application Nos. 10-2004-0089774, filed on Nov. 5, 2004, and 10-2004-0112146, filed on December 24, in the Korean Intellectual Property Office, the disclosures of which are incorporated herein in their entirety by reference.

BACKGROUND OF THE INVENTION

1. Field of the Invention

The present invention relates to an image sensing device, and more particularly, to a pixel designed to increase a speed at which charges are transmitted, an image sensor with a wide extended dynamic range, and an image sensing device including the image sensor.

2. Description of the Related Art

An image sensor includes a plurality of pixels that receive external light and produce electric charges, and converts an optical image into an electrical signal.

FIG. 1 illustrates a semiconductor device 101 in which pixels of a conventional charge coupling device (CCD) type imaging device are formed. Referring to FIG. 1, the semiconductor device 101 includes a plurality of pixels 111, a plurality of vertical transmission lines 161, and a single horizontal transmission line 171.

Each of the pixels 111 includes a photo diode area 121, a transmission gate area 131 formed on one side of the photo diode area 121, a vertical transmission area 141 formed adjacent to the photo diode area 121, and a channel stop area 151 formed on the three remaining sides of the photo diode area 121.

The vertical transmission lines 161 each include vertical transmission areas 141 and are all connected to the horizontal transmission line 171.

In the convention pixel 111, the photo diode area 121 has a rectangular shape, and the transmission gate area 131 is formed on a portion of a side of the photo diode area 121. Because the shape of the photo diode area 121 is rectangular, charges generated in the photo diode area 121 are collected at corners of the rectangular photo diode area 121. The collection of the charges at the corners of the rectangular photo diode area 121 delays transmission of the charges generated in the pixels 111 to the horizontal transmission line 171 via the vertical transmission lines 161. This delayed transmission causes a reduction of the speed of imaging by an imaging device.

In addition, since light-receiving elements included in a conventional image sensor receive identical amounts of light, it is difficult for the conventional image sensor to have a high dynamic range. In a current situation, an image sensing device must use two or more image sensors to obtain a high dynamic range. However, the use of two or more image sensors increases the costs for manufacturing the image sensing device, resulting in a high-priced image sensing device.

SUMMARY OF THE INVENTION

The present invention provides a pixel structure that improves a transmission speed.

The present invention also provides an image sensor that can provide a high dynamic range at a low cost and an image sensing device including the image sensor.

According to an aspect of the present invention, there is provided a pixel of a charge coupling device (CCD) type imaging apparatus formed on a semiconductor device, the pixel including: a photo diode area formed in an oval shape, generating charges when external light is incident upon the photo diode area; a channel stop area formed in a semi-oval shape along one side of the photo diode area, blocking external charges from flowing into the photo diode area and internal charges from flowing out of the photo diode area; a transmission gate area curved along the other side of the photo diode area, controlling a transmission of the internal charges generated in the photo diode area to the outside of the transmission gate area; and a vertical transmission area formed adjacent to the transmission gate area, transmitting charges received from the transmission gate area to the outside of the vertical transmission area.

A polysilicon layer may be formed in the transmission gate area, and when a control signal is applied to the polysilicon layer, the transmission gate area may be activated to transmit charges generated in the photo diode area to the vertical transmission area.

A polysilicon layer may be formed in the vertical transmission area, and when a control signal is applied to the polysilicon layer, the vertical transmission area may be activated to transmit the charges received from the transmission gate area to the outside of the vertical transmission area.

According to another aspect of the present invention, there is provided an image sensor including: a semiconductor substrate; a plurality of light-receiving elements formed on the semiconductor substrate; and light-shield films formed on upper ends of some of the light-receiving elements to partially block light incident upon each of the some light-receiving elements.

The light-receiving elements may include photo diodes that receive light.

Lines of light-receiving elements covered with the light-shield films and lines of light-receiving elements on which no light-shield films are formed may be arranged in such a way that one line of light-receiving elements covered with the light-shield film alternates with one line of light-receiving elements on which no light-shield films are formed.

The image sensor may further include: a plurality of first vertical transmission electrodes formed on the semiconductor substrate, transmitting an electrical signal output from the light-receiving elements covered with the light-shield films to the outside; a plurality of second vertical transmission electrodes formed on the semiconductor substrate, transmitting an electrical signal output from the light-receiving elements having no light-shield films thereon to the outside; a plurality of vertical charge transmission units formed on the semiconductor substrate, electrically connected to the light-receiving elements, and transmitting charges received from the light-receiving elements; at least one horizontal charge transmission unit formed on the semiconductor substrate, electrically connected to the vertical charge transmission units, and receiving charges received from the vertical charge transmission units; and at least one horizontal transmission electrode formed on the semiconductor substrate, electrically connected to the horizontal charge transmission unit, and transmitting an electrical signal received from the horizontal charge transmission unit to the outside.

According to another aspect of the present invention, there is provided an image sensing device including: the above-described image sensor; a first analog-to-digital converter converting an electrical signal received from the light-receiving elements covered with the light-shield films into a digital signal; a second analog-to-digital converter converting an electrical signal received from the light-receiving elements having no light-shield films thereon to a digital signal; a comparator comparing values of the digital signals output from the first and second analog-to-digital converters with a value of a reference signal and detecting and outputting a signal greater than the reference signal value and a signal smaller than the reference signal value; and a digital-to-analog converter converting the signals output by the comparator into analog signals.

The image sensing device may further include: a first amplification unit amplifying the electrical signal received from the light-receiving elements covered with the light-shield films and outputting the amplified signal to the first analog-to-digital converter; and a second amplification unit amplifying the electrical signal received from the light-receiving elements having no light-shield films thereon and outputting the amplified signal to the second analog-to-digital converter.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
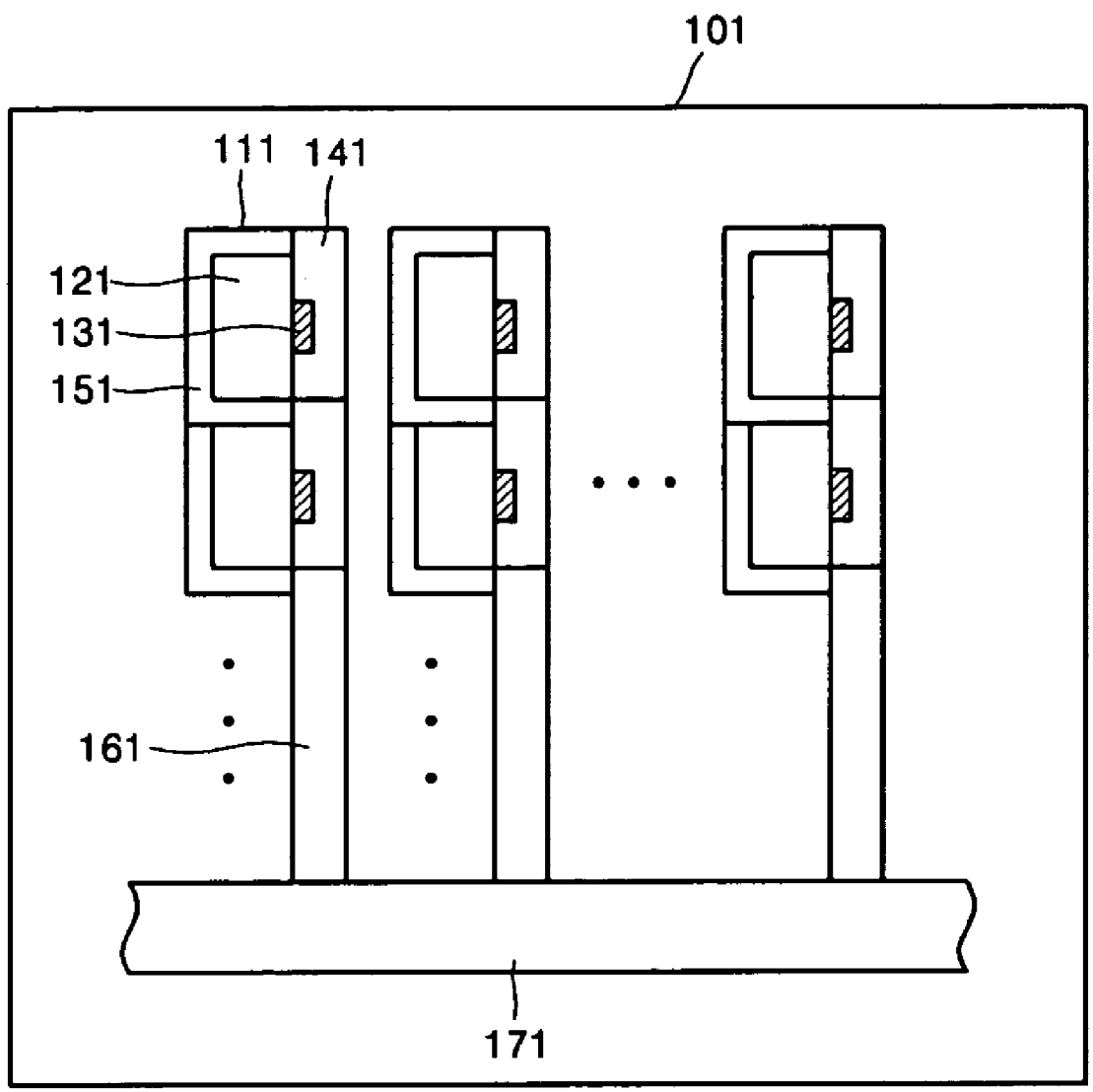
FIG. 1 illustrates a semiconductor device in which pixels of a conventional charge coupling device (CCD) type imaging device are formed.

Hereinafter, the present invention will be described in detail by explaining preferred embodiments of the invention with reference to the attached drawings. Like reference numerals in the drawings denote like elements.

Figure 2:
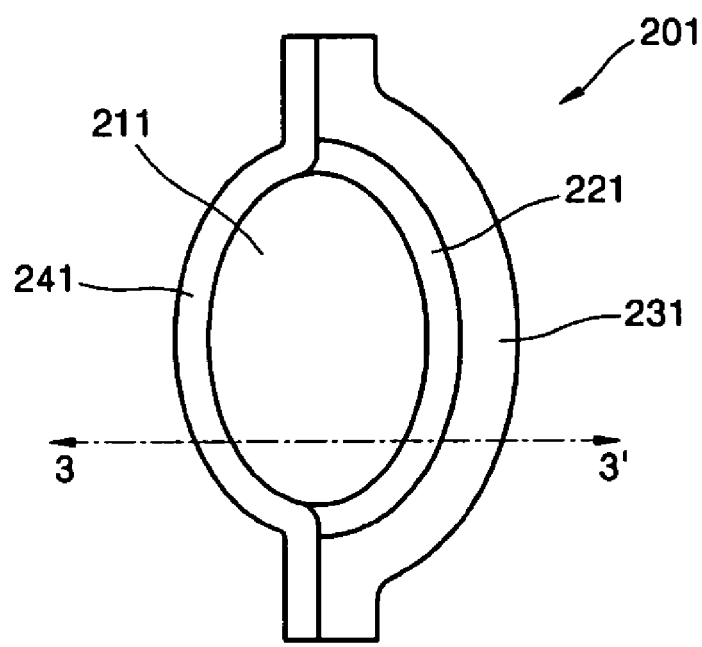
FIG. 2 illustrates a structure of a pixel of a CCD type imaging device according to an embodiment of the present invention.

FIG. 2 illustrates a structure of a pixel 201 of a charge coupling device (CCD) type imaging device according to an embodiment of the present invention. Referring to FIG. 2, the pixel 201 includes a photo diode area 211, a transmission gate area 221, a vertical transmission area 231, and a channel stop area 241.

The photo diode area 211 produces charges when receiving external light and accumulates the generated charges. The photo diode area 211 has an oval shape.

The transmission gate area 221 is formed on one side of the photo diode area 211. For example, the transmission gate area 221 is formed along one side of the photo diode area 211 to have an oval shape. The transmission gate area 221 controls a transmission of charges generated in the photo diode area 211 to the vertical transmission area 231.

The vertical transmission area 231 is formed adjacent to the transmission gate area 221. More specifically, the vertical transmission area 231 is formed along one side of the transmission gate area 221 to have an oval shape. The vertical transmission area 231 transmits charges received via the transmission gate area 221 or received from an external source to a horizontal transmission line (not shown).

The channel stop area 241 is formed along the other side of the photo diode area 211 to be curved. The channel stop area 241 stops external charges from flowing into the photo diode area 211 and charges generated in the photo diode area 211 from flowing out of the photo diode area 211.

Figure 3:
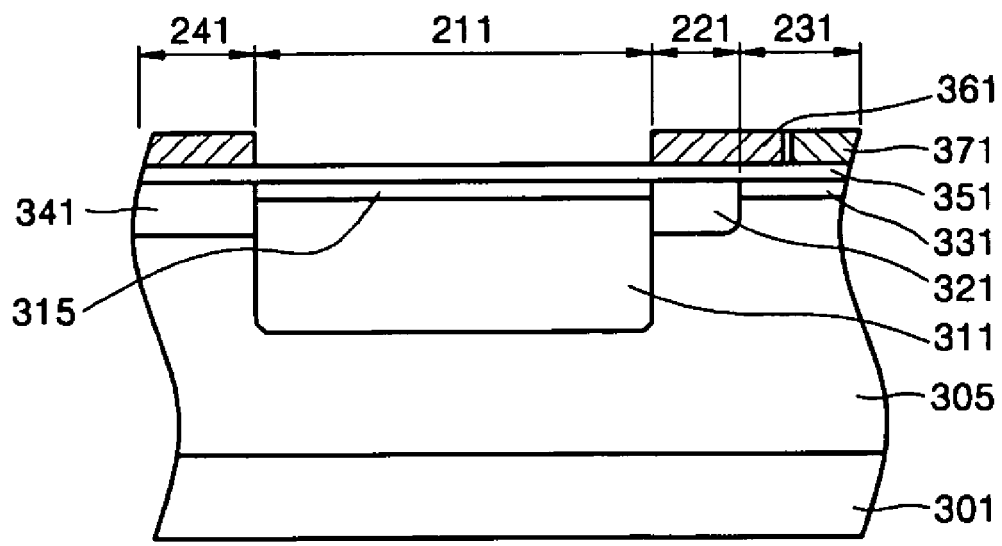
FIG. 3 is a cross-sectional view of the pixel of FIG. 2 taken along line 3–3'.

FIG. 3 is a cross-sectional view of the pixel 201 taken along line 3–3'. Referring to FIG. 3, a P-well region 305 is formed on a semiconductor substrate 301. An N-type region 311 for forming the photo diode area 211, a P-type region 321 for forming the transmission gate area 221, an N-type region 331 for forming the vertical transmission area 231, and a P-type region 341 for forming the channel stop area 241 are formed in the P well region 305. A silicon oxide layer 351 is formed to protect the regions 315, 321, 331, and 341.

More specifically, the semiconductor substrate 301 is formed of N-type semiconductor.

The N-type region 311 is an N-type charge-accumulated region that is formed in the photo diode area 211 and forms a PN junction with the P well region 305, thereby accumulating charges generated by incident light. The N-type region 311 is covered with a P-type surface layer 315 with a high acceptor concentration to prevent an increase of dark current produced by a depletion of an interface between the photo diode area 211 and the silicon oxide layer 351.

The transmission gate area 221 is formed between the photo diode area 211 and the vertical transmission area 231. The transmission gate area 221 includes the P-type region 321, which is a voltage control area that is doped with P-type boron and controls a threshold voltage. A first polysilicon layer 361 is formed over the P-type region 321.

The N-type region 331 is formed in the vertical transmission area 231. The first polysilicon layer 361 and a second polysilicon layer 371 are formed over the N-type region 331.

The channel stop area 241 is formed opposite to the transmission gate area 221 and includes the P-type region 341. The P-type region 341 is doped with high P-type boron.

When light is incident upon the photo diode area 211, charges are generated and accumulated in the N-type region 311. At this time, when a control signal is applied to the first polysilicon layer 361, the P-type region 321 is activated to thereby form a transmission channel. Accordingly, the charges accumulated in the N-type region 311 are transmitted to the N-type region 331 via the transmission channel. Thereafter, when the application of the control signal is stopped, the P-type region 321 is inactivated, and so the transmission channel disappears. The N-type region 311 produces and accumulates charges corresponding to a next period.

The charges transmitted to the vertical transmission area 231 move parallel to each other in a vertical direction to be transmitted to a horizontal transmission line (not shown). The charges that have reached the horizontal transmission line are transmitted horizontally until next charges are received from the vertical transmission area 231. The horizontally transmitted charges undergo an amplification process and are discharged to the outside.

Figure 4:
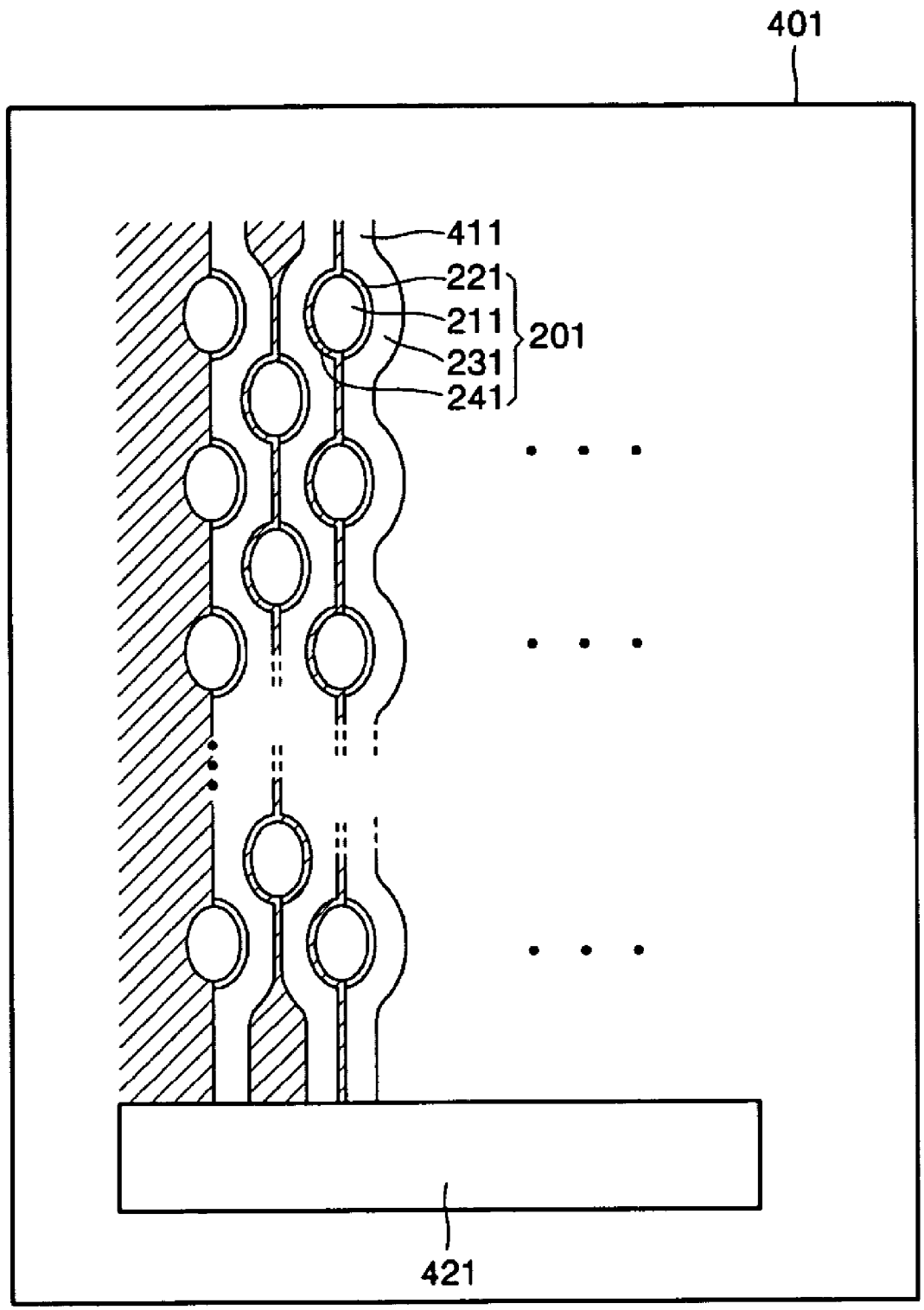
FIG. 4 schematically illustrates a structure of a semiconductor device including a plurality of pixels shown in FIG. 3.

FIG. 4 schematically illustrates a structure of a semiconductor device 401 including a plurality of pixels shown in FIG. 2. Referring to FIG. 4, the semiconductor device 401 includes a plurality of pixels 201, a plurality of vertical transmission lines 411, and a single (or two) horizontal transmission line 421. The pixels 201 are consecutively aligned between two vertical transmission lines 411 to have a honeycomb configuration, thereby increasing the integration.

Figure 5:
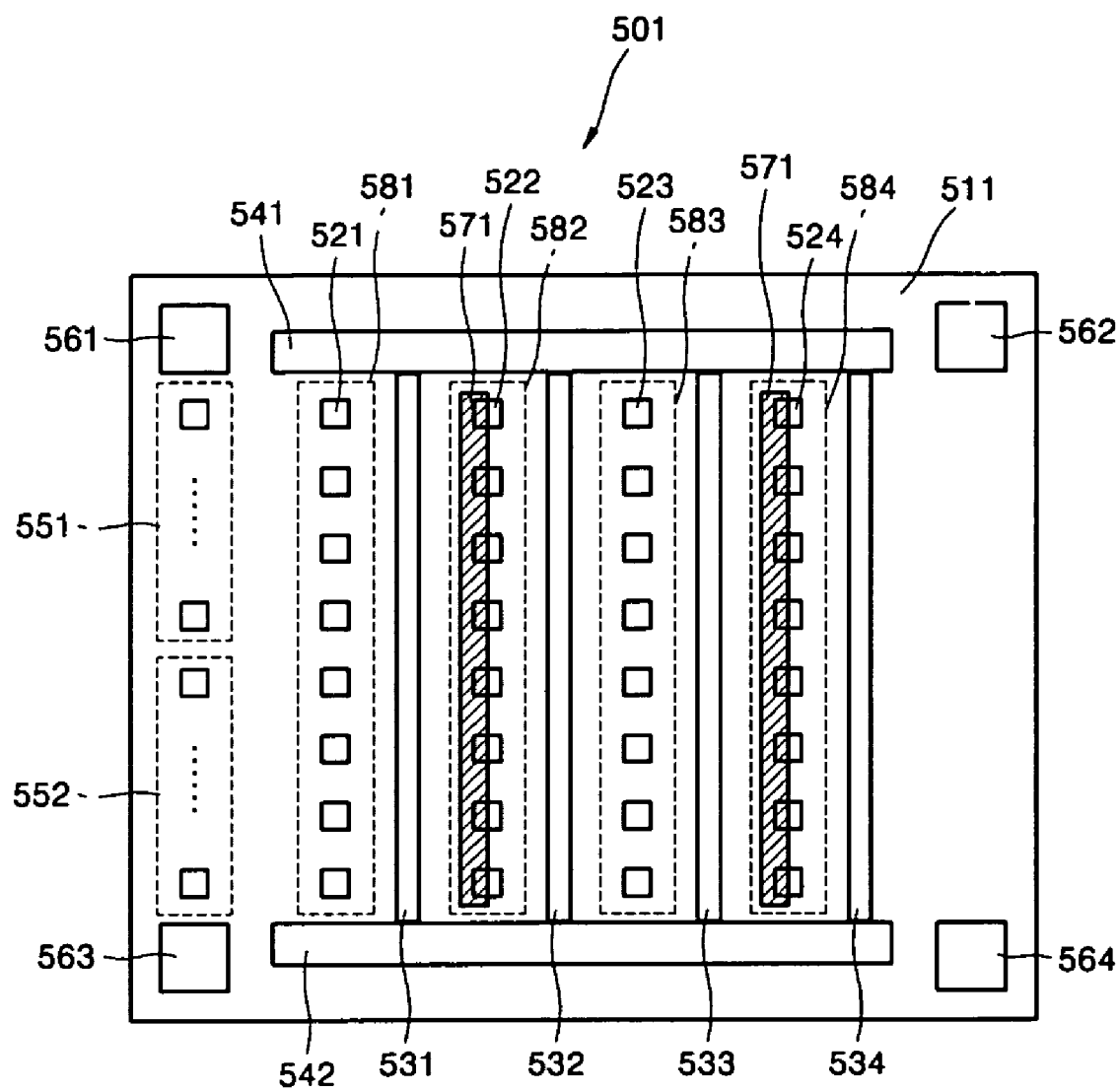
FIG. 5 is a plan view conceptually illustrating an image sensor according to another embodiment of the present invention.

FIG. 5 is a plan view conceptually illustrating an image sensor 501 according to another embodiment of the present invention. Referring to FIG. 5, the image sensor 501 includes a semiconductor substrate 511, light-receiving elements 521 through 524, a plurality of vertical charge transmission units 531 through 534, horizontal charge transmission units 541 and 542, a plurality of first vertical transmission electrodes 551, a plurality of second vertical transmission electrodes 552, and horizontal transmission electrodes 561 through 564. The light-receiving elements 521 through 524, the vertical charge transmission units 531 through 534, the horizontal charge transmission units 541 and 542, the first vertical transmission electrodes 551, the second vertical transmission electrodes 552, and the horizontal transmission electrodes 561 through 564 are installed on the semiconductor substrate 511.

The light-receiving elements 521 through 524 receive external light, convert the light into an electrical signal, and output the electrical signal. Each of the light-receiving elements 521 through 524 includes a photo diode that receives light. The light-receiving elements 521 through 524 are divided into two types of: light-receiving elements 522 and 524 on which light-shield films 571 are mounted, respectively; and light-receiving elements 521 and 523 on which no light-shield films are mounted. The light-receiving elements 522 and 524, respectively having the light-shield films 571 and 572 thereon, receive a small amount of light from an external source. The light-receiving elements 521 and 523, having no light-shield films thereon, receive a large amount of light from the external source.

As shown in FIG. 5, the light-shield film 571 may be formed with a size that can cover only a half of each of the light-receiving elements 522 and 524. However, the light-shield film 571 may have various sizes according to the purpose. For example, the light-shield film 571 may have a size that covers only ⅓ of the area of each of the light-receiving elements 522 and 524. Alternatively, the light-shield film 571 may have a size that covers only ¼ of the area of each of the light-receiving elements 522 and 524. By including the light-receiving elements 522 and 524 on which the light-shield films 571 of different sizes and selectively controlling operations of the light-receiving elements 522 and 524, the image sensor 501 can detect various images with various characteristics and also variously analyze a single image.

Lines 582 and 584, which include the light-receiving elements 522 and the light-receiving elements 524, respectively, having the light-shield film 571 thereon, and lines 581 and 583, which include the light-receiving elements 521 and the light-receiving elements 523, respectively, having no light-shield film 571 thereon, are arranged on the semiconductor substrate 511 in such a way that a line covered with a light-shield film alternates with a line having no light-shield film thereon. Hence, the image sensor 501 can sense two types of optical images under an identical condition when receiving light associated with an external image.

The first vertical transmission electrodes 551 are electrically connected to the light-receiving elements 522 and 524 on which the light-shield films 571 are formed. When being connected to an external system (not shown), the first vertical transmission electrodes 551 receive an electrical signal output from the light-receiving elements 522 and 524 having the light-shield film 571 thereon and transmit the electrical signal to the external system.

The second vertical transmission electrodes 552 are electrically connected to the light-receiving elements 521 and 523 on which no light-shield films are formed. When being connected to the external system, the second vertical transmission electrodes 552 receive an electrical signal output from the light-receiving elements 521 and 523 having no light-shield films thereon and transmit the electrical signal to the external system.

The vertical charge transmission units 532 and 534 are electrically connected to the light-receiving elements 522 and 524 having the light-shield film 571 thereon and transmits charges received from the light-receiving elements 522 and 524 to the horizontal charge transmission units 541 and 542.

The vertical charge transmission units 531 and 533 are electrically connected to the light-receiving elements 521 and 523 having no light-shield films thereon and transmits charges received from the light-receiving elements 521 and 523 to the horizontal charge transmission units 541 and 542.

The horizontal charge transmission units 541 and 542 are electrically connected to the vertical charge transmission units 531 through 534 and transmit the charges received from the vertical charge transmission units 531 through 534 to the horizontal transmission electrodes 561 through 564. Although the horizontal charge transmission units 541 and 542 are formed on a top side and a bottom side, respectively, of the vertical charge transmission units 531 through 534 in FIG. 5, a single horizontal charge transmission unit may be formed on the bottom side of the vertical charge transmission units 531 through 534.

The horizontal transmission electrodes 561 through 564 are electrically connected to the horizontal charge transmission units 541 and 542. When being connected to the external system, the horizontal transmission electrodes 561 through 564 receive electrical signals from the horizontal charge transmission units 541 and 542 and transmit the electrical signals to the external system. The horizontal transmission electrodes 561 through 564 may be connected to either only one sides or both sides of the horizontal charge transmission units 541 and 542.

Figure 6:
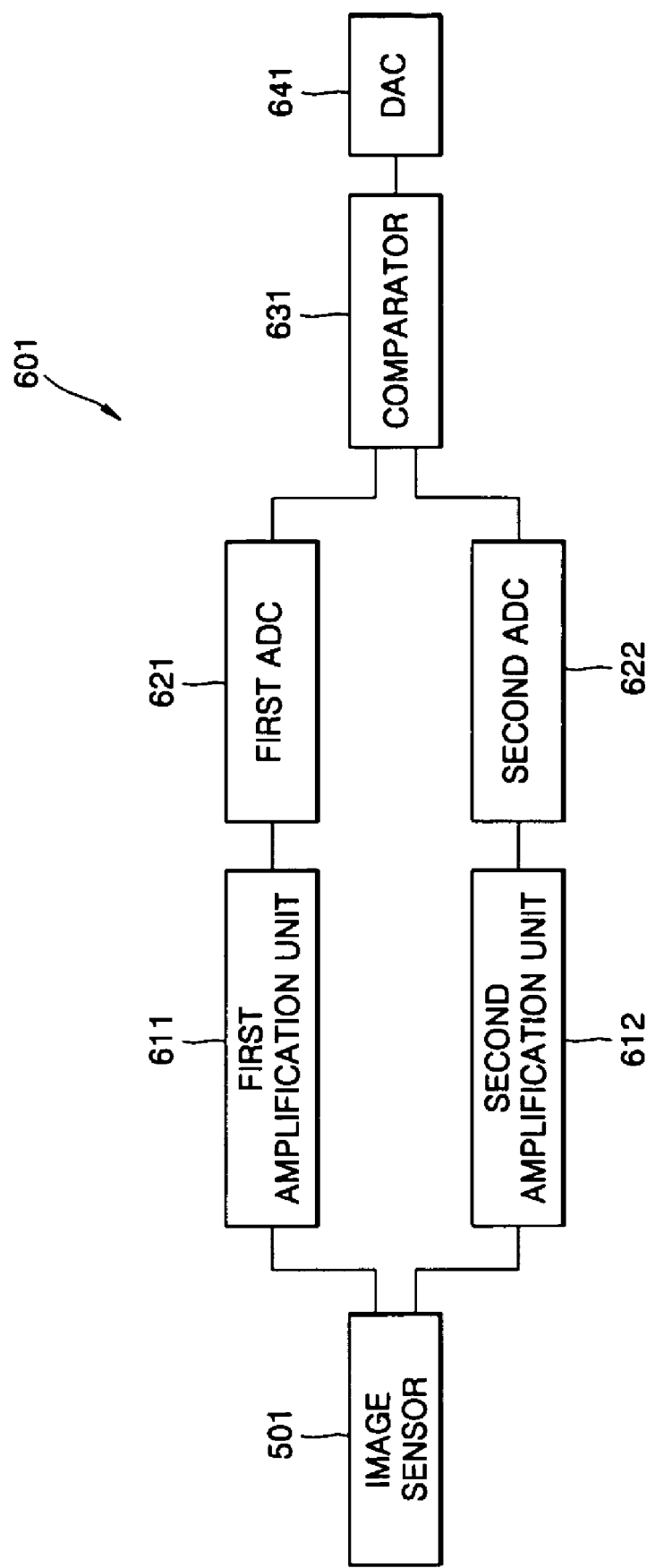
FIG. 6 is a block diagram of an image sensing system including the image sensor of FIG. 5.

FIG. 6 is a block diagram of an image sensing system 601 according to an embodiment of the present invention. Referring to FIG. 6, the image sensing system 601 includes the image sensor 50, first and second amplification units 611 and 612, first and second analog-to-digital converters (ADCs) 621 and 622, a comparator 631, and a digital-to-analog converter (DAC) 641.

The image sensor 501 has already been described in detail with reference to FIG. 5.

The first amplification unit 611 is electrically connected to the first vertical transmission electrodes 551 of FIG. 5. Because an electrical signal output from the first vertical transmission electrodes 551 of FIG. 5 is very weak, the first amplification unit 611 amplifies the electrical signal. Because the number of first vertical transmission electrodes 551 is plural, the first amplification unit 611 includes a plurality of amplifiers connected to the plurality of first vertical transmission electrodes 551 of FIG. 5.

The second amplification unit 612 is electrically connected to the second vertical transmission electrodes 552 of FIG. 5. Because an electrical signal output from the second vertical transmission electrodes 552 of FIG. 5.*is* very weak, the second amplification unit 612 amplifies the electrical signal. Because the number of second vertical transmission electrodes 552 is plural, the second amplification unit 612 includes a plurality of amplifiers connected to the plurality of second vertical transmission electrodes 552 of FIG. 5.

The first ADC 621 is connected to the first amplification unit 611 and converts a signal output from the first amplification unit 611 into a digital signal.

The second ADC 622 is connected to the second amplification unit 612 and converts a signal output from the first amplification unit 612 into a digital signal.

The comparator 631 compares the digital signals output from the first and second ADCs 621 and 622 with a reference signal value and detects a signal greater than the reference signal value and a signal smaller than the reference signal value.

The DAC 614 converts the signals output from the comparator 63 into analog signals.

As such, the image sensing system 601 detects both a signal with a high light amount and a signal with a low light amount from the single image sensor 501, thus capturing an accurate image regardless of a bright environment or a dark environment. Also, the costs for manufacturing the image sensing system 601 can be reduced.

As described above, the oval shape of the pixel 201 prevents charges from being collected at one place within the photo diode area 211, thus increasing a speed at which the charges generated in the photo diode area 211 are transmitted to the vertical transmission area 231 via the transmission gate area 221. Consequently, an image sensing speed of a CCD type imaging device increases.

In addition, because the image sensor 501 includes the light-receiving elements 522 and 524 covered with the light-shield films 571 aid the light-receiving elements 521 and 523 having no light-shield films thereon formed on the semiconductor substrate 511, the image sensing device 601 can detect an accurate image regardless of whether the environment is bright or dark. Furthermore, the costs for manufacturing the image sensing system 601 can be reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A pixel of a charge coupling device (CCD) type imaging apparatus formed on a semiconductor device, the pixel comprising:
    a photo diode area formed in an oval shape, generating charges when external light is incident upon the photo diode area;
    a channel stop area formed in a semi-oval shape along one side of the photo diode area, blocking external charges from flowing into the photo diode area and internal charges from flowing out of the photo diode area;
    a transmission gate area curved along the other side of the photo diode area, controlling a transmission of the internal charges generated in the photo diode area to the outside of the transmission gate area; and
    a vertical transmission area formed adjacent to the transmission gate area, transmitting charges received from the transmission gate area to the outside of the vertical transmission area.

2. The pixel of the CCD type imaging apparatus of claim 1, wherein a polysilicon layer is formed in the transmission gate area, and when a control signal is applied to the polysilicon layer, the transmission gate area is activated to transmit charges generated in the photo diode area to the vertical transmission area.

3. The pixel of the CCD type imaging apparatus of claim 1, wherein a polysilicon layer is formed in the vertical transmission area, and when a control signal is applied to the polysilicon layer, the vertical transmission area is activated to transmit the charges received from the transmission gate area to the outside of the vertical transmission area.

* * * * *